US007851972B2

(12) United States Patent
Takasan et al.

(10) Patent No.: US 7,851,972 B2
(45) Date of Patent: Dec. 14, 2010

(54) VIBRATION ACTUATOR

(75) Inventors: Masaki Takasan, Aichi (JP); Hirohiko Ishikawa, Aichi (JP); Kazuo Seiki, Aichi (JP); Kentaro Nakamura, Kanagawa (JP); Sadayuki Ueha, Kanagawa (JP)

(73) Assignees: Kabushiki Kaisha Toyota Jidoshokki, Aichi-ken (JP); Tokyo Institute of Technology, Tokyo (JP)

( * ) Notice: Subject to any disclaimer, the term of this patent is extended or adjusted under 35 U.S.C. 154(b) by 369 days.

(21) Appl. No.: 12/083,124

(22) PCT Filed: Feb. 21, 2007

(86) PCT No.: PCT/JP2007/053175

§ 371 (c)(1),
(2), (4) Date: Apr. 4, 2008

(87) PCT Pub. No.: WO2007/129497

PCT Pub. Date: Nov. 15, 2007

(65) Prior Publication Data

US 2009/0267450 A1 Oct. 29, 2009

(30) Foreign Application Priority Data

Apr. 10, 2006 (JP) .............................. 2006-107670

(51) Int. Cl.
*H02N 2/00* (2006.01)
(52) U.S. Cl. ............................ 310/323.04; 310/323.01; 310/323.02; 310/323.06; 310/323.13; 310/323.16; 310/323.17
(58) Field of Classification Search ............ 310/323.01, 310/323.02, 323.04, 323.06, 323.13, 323.16, 310/323.17
See application file for complete search history.

(56) References Cited

U.S. PATENT DOCUMENTS 4,400,641 A * 8/1983 Vishnevsky et al. .... 310/323.02

(Continued)

FOREIGN PATENT DOCUMENTS

CN 101072001 A * 11/2007

(Continued)

OTHER PUBLICATIONS

International Search Report for the corresponding PCT application No. PCT/JP2007/053175, mailed on May 15, 2007.

(Continued)

*Primary Examiner*—Thomas M Dougherty
(74) *Attorney, Agent, or Firm*—Locke Lord Bissell & Liddell LLP

(57) ABSTRACT

It is an subject of the present invention to provide a vibration actuator in which a plurality of rotors can be driven by a single vibration unit.

When a composite vibrator (2) is driven to generate a composite vibration combining a plurality of vibrations, a first stator (3) and a second stator (4) vibrate, thereby causing elliptical movements in corner portions (8) and (9) of the first stator (3) and the second stator (4), respectively. As a result, a first rotor (A) abutting onto and pressurized against the corner portion (8) of the first stator (3) and a second rotor (B) abutting onto and pressurized against the corner portion (9) of the second stator (4) are rotated at the same time. Further, in this case, by selecting vibration modes of the plurality of vibrations constituting the composite vibration, the two rotors (A) and (B) can be rotated in the same direction or in opposite directions with respect to each other.

10 Claims, 15 Drawing Sheets

U.S. PATENT DOCUMENTS

| | | | |
|---|---|---|---|
| 4,947,076 A * | 8/1990 | Kumada | 310/323.02 |
| 5,008,581 A * | 4/1991 | Kumada et al. | 310/323.02 |
| 5,254,899 A * | 10/1993 | Suzuki et al. | 310/323.03 |
| 5,548,176 A * | 8/1996 | Oda | 310/328 |
| 5,554,905 A * | 9/1996 | Gschwind et al. | 310/323.02 |
| 6,262,514 B1 * | 7/2001 | Bansevicius et al. | 310/323.01 |
| 6,380,660 B1 * | 4/2002 | Maeno et al. | 310/323.02 |
| 2009/0267455 A1 * | 10/2009 | Takasan et al. | 310/323.16 |

FOREIGN PATENT DOCUMENTS

| | | | |
|---|---|---|---|
| JP | 61-054883 A | * | 3/1986 |
| JP | 63-262071 A | * | 10/1988 |
| JP | 05-038170 | | 2/1993 |
| JP | 05-038170 A | | 2/1993 |
| JP | 09-168288 | | 6/1997 |
| JP | 11-220892 | | 8/1999 |
| JP | 2006-005975 | | 1/2006 |
| JP | 2006-005975 A | | 1/2006 |

OTHER PUBLICATIONS

English Abstract of JP 2004-357398 (published Dec. 16, 2004).
Korean Official Notification for counterpart application, dated Sep. 27, 2010.

* cited by examiner

VIBRATION ACTUATOR

FIELD OF THE INVENTION

The present invention relates to a vibration actuator, and more specifically, to a vibration actuator in which a stator is caused to vibrate by a vibration means, thereby rotating a rotor in contact with the stator.

BACKGROUND OF THE INVENTION

For example, Patent Document 1 discloses a vibration actuator employing ultrasonic vibration to rotate a rotor. The vibration actuator has a composite vibrator as a vibration means, the vibrator including a plurality of piezoelectric element plates overlapping each other. A stator is arranged on one end portion of the composite vibrator, and a single rotor is supported by the stator so as to contact with the stator. By applying driving voltages to the plurality of piezoelectric element plates of the composite vibrator, a plurality of vibrations in different directions are generated and combined with each other to form a composite vibration. Then, the composite vibration causes the stator to vibrate, thereby rotating the rotor.

Patent Document 1: JP 11-220892 A

SUMMARY OF THE INVENTION

Problems to be Solved by the Invention

However, in the vibration actuator of Patent Document 1, a single composite vibrator rotates a single rotor. Therefore, when it is intended to rotate a plurality of rotors, respectively, it is necessary to provide a plurality of dedicated composite vibrators corresponding to the rotors, and to control driving of the plurality of composite vibrators independently of each other, thereby making the vibration actuator complicated.

The present invention has been made to solve the above-mentioned problems. It is an object of the present invention to provide a vibration actuator in which a plurality of rotors can be driven by a single vibration means.

Means for Solving the Problems

A vibration actuator according to the present invention includes: two stators; two rotors arranged so as to be in contact with the two stators, respectively; a single vibration means arranged between the two stators for generating a composite vibration combining a plurality of vibrations in different directions to vibrate the two stators, thereby rotating the two rotors at the same time.

EFFECT OF THE INVENTION

According to the present invention, it is possible to obtain a vibration actuator capable of driving a plurality of rotors by a single vibration means.

BRIEF DESCRIPTION OF THE DRAWINGS

FIG. 4b is a view showing displacement in the Y-axis direction of each portion of the actuator main body shown in FIG. 4a.

DETAILED DESCRIPTION OF THE PREFERRED EMBODIMENTS

Hereinafter, embodiments of the present invention will be described with reference to the drawings.

First Embodiment

Figure 1:
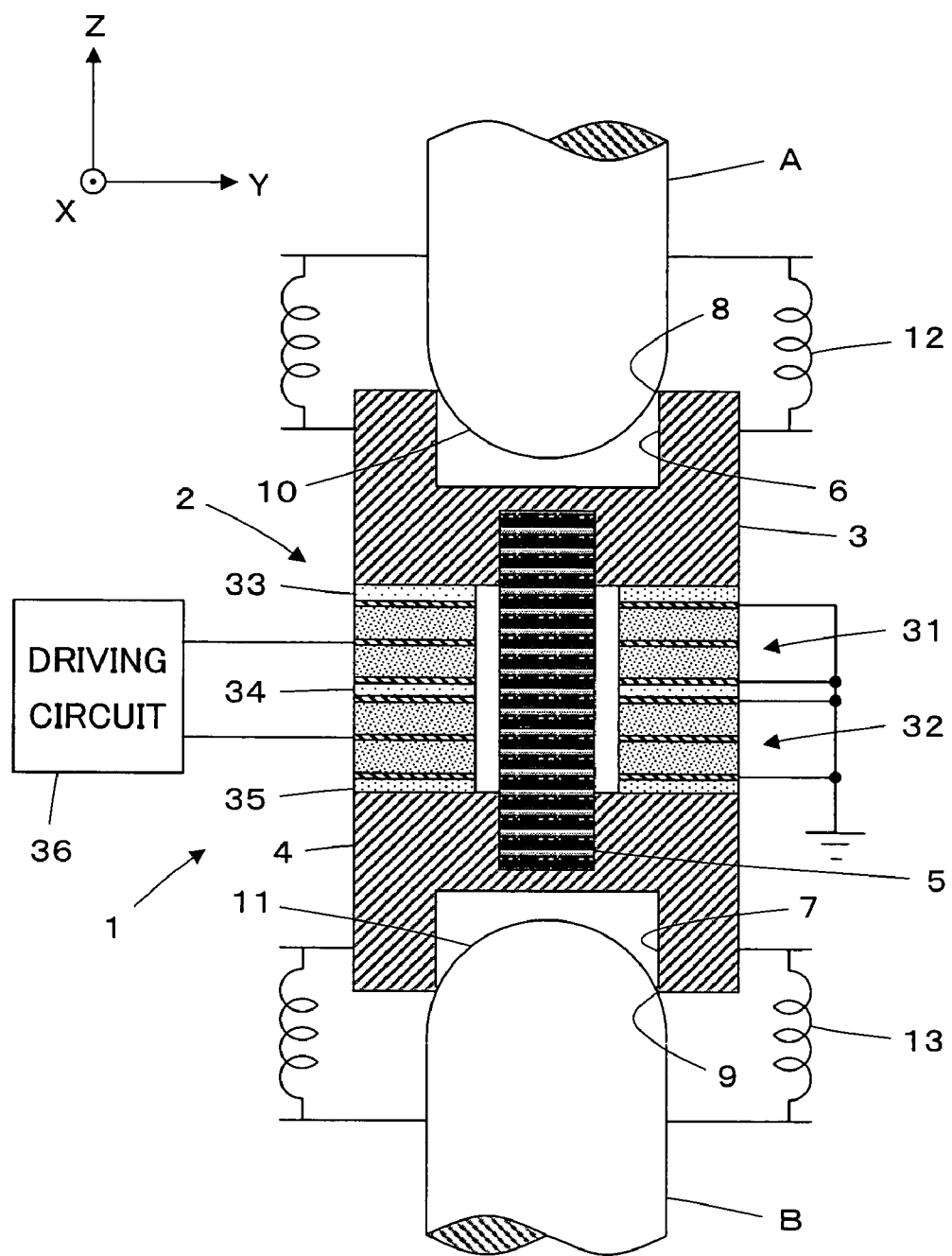
FIG. 1 is a sectional view showing a vibration actuator according to a first embodiment of the present invention.

FIG. 1 shows a vibration actuator according to a first embodiment of the present invention. The vibration actuator is an ultrasonic actuator in which a rotor is rotated by utilizing ultrasonic vibration. The vibration actuator includes an actuator main body 1 and two rotors A and B rotated by the actuator main body 1. The actuator main body 1 has a single cylindrical composite vibrator 2, and a first stator 3 and a second stator 4 arranged on both end portions of the composite vibrator 2, respectively. The first stator 3 and the second stator 4 sandwich the composite vibrator 2 therebetween and are connected to each other through a connection bolt 5 allowed to pass through the composite vibrator 2, thereby constituting the actuator main body 1 having a substantially column-like outer configuration. Here, for convenience of description, it is assumed that a central axis of the actuator main body 1 extending from the second stator 4 to the first stator 3 is defined as a Z axis, an X axis extends perpendicularly to the Z axis, and a Y axis extends perpendicularly to both the Z axis and the X axis.

The composite vibrator 2 has a plate-like first piezoelectric element portion 31 and a plate-like second piezoelectric element portion 32 which are positioned on XY planes and are stacked on each other. The piezoelectric element portions 31 and 32 are arranged so as to be electrically insulated from the first stator 3 and the second stator 4, respectively, and from each other through intermediation of insulating sheets 33 to 35. Further, the vibration actuator has a driving circuit 36 which applies driving voltages to the first piezoelectric element portion 31 and the second piezoelectric element portion 32 to thereby drive them.

The first stator 3 and the second stator 4 are provided with recesses 6 and 7, respectively, formed on the opposite sides to surfaces thereof in contact with the composite vibrator 2. Opening end peripheral portions of the recesses 6 and 7 are formed with annular corner portions 8 and 9, respectively, positioned on XY planes. Here, the first rotor A has a semispherical convex portion 10 opposed to the recess 6 of the first stator 3 and having a diameter larger than an inner diameter of the recess 6. The convex portion 10 abuts onto the corner portion 8 of the first stator 3 to be rotatably supported. Similarly, the second rotor B has a semispherical convex portion 11 opposed to the recess 7 of the second stator 4 and having a diameter larger than an inner diameter of the recess 7. The convex portion 11 abuts onto the corner portion 9 of the second stator 4 to be rotatably supported. Further, the rotors A and B are in contact with and pressurised against the corresponding stators 3 and 4 by springs 12 and 13, respectively.

Figure 2:
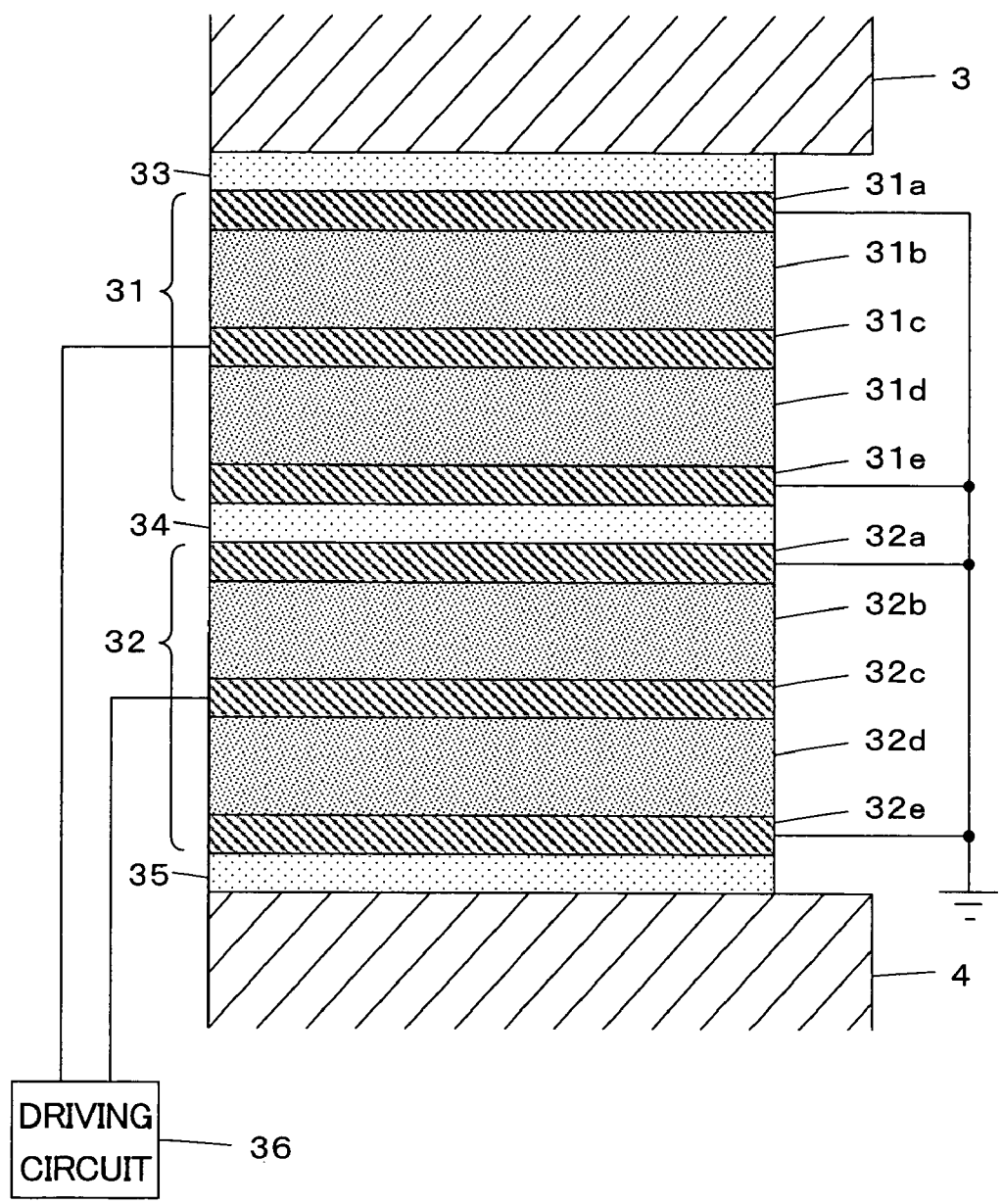
FIG. 2 is a partial sectional view showing a structure of a composite vibrator used in the first embodiment.

As shown in FIG. 2, the first piezoelectric element portion 31 of the composite vibrator 2 has a structure in which an electrode plate 31a, a piezoelectric element plate 31b, an electrode plate 31c, a piezoelectric element plate 31d, and an electrode plate 31e each having a disc-like shape, are overlapped each other in the stated order. Similarly, the second piezoelectric element portion 32 has a structure in which an electrode plate 32a, a piezoelectric element plate 32b, an electrode plate 32c, a piezoelectric element plate 32d, and an electrode plate 32e each having a disc-like shape, are overlapped each other in the stated order.

The electrode plate 31a and the electrode plate 31e which are arranged on both surface sides of the first piezoelectric element portion 31, and the electrode plate 32a and the electrode plate 32e which are arranged on both surface sides of the second piezoelectric element portion 32 are electrically grounded, respectively. Further, a terminal led out from the electrode plate 31c arranged between the pair of piezoelectric element plates 31b and 31d of the first piezoelectric element portion 31 is connected to the driving circuit 36, and a terminal led out from the electrode plate 32c arranged between the pair of piezoelectric element plates 32b and 32d of the second piezoelectric element portion 32 is also connected to the driving circuit 36.

Figure 3:
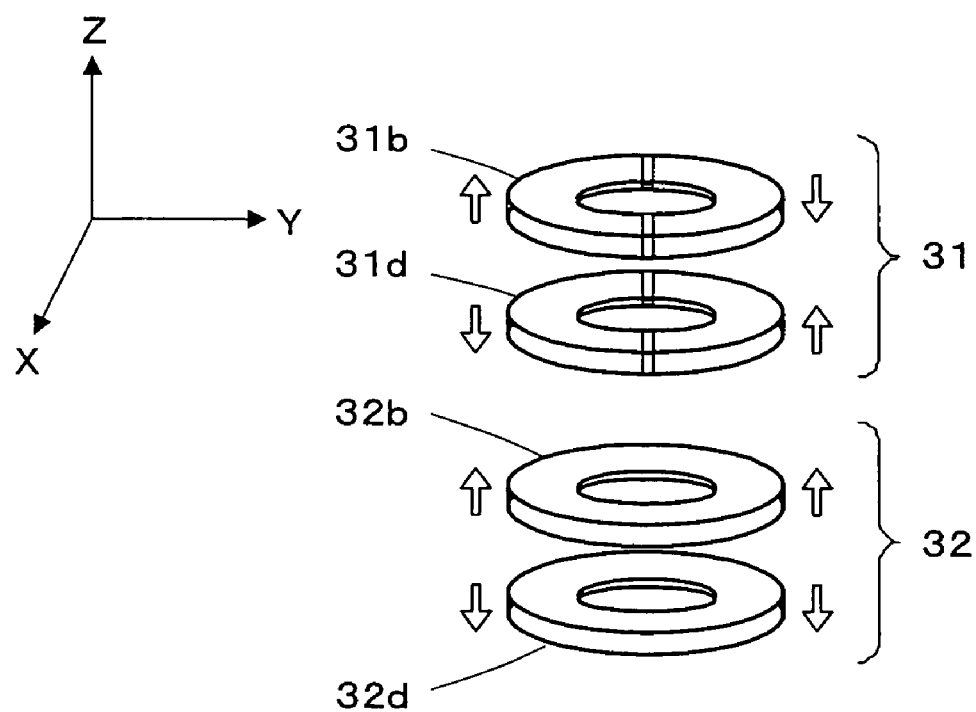
FIG. 3 is a perspective view showing a polarization direction of two pairs of piezoelectric element plates of the composite vibrator used in the first embodiment.

As shown in FIG. 3, each of piezoelectric element plates 31b and 31d of the first piezoelectric element portion 31 is divided into two portions in the Y-axis direction and is polarized so that the two portions thereof have opposite polarities to exhibit opposite deformation behaviors to each other, that is, expansion and contraction in the Z-axis direction (thickness direction). The piezoelectric element plate 31b and the piezoelectric element plate 31d are arranged in reverse orientations to each other.

Each of piezoelectric element plates 32b and 32d of the second piezoelectric element portion 32 is not divided into two portions and is polarized such that each plate 32b and 32d as a whole exhibits a deformation behavior, that is, expansion or contraction in the Z-axis direction (thickness direction). The piezoelectric element plate 32b and the piezoelectric element plate 32d are arranged in reverse orientations to each other.

Figure 4A:
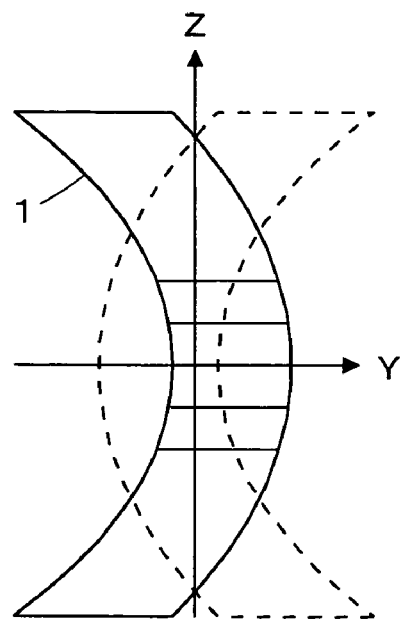
FIG. 4a is a view showing a state where the actuator main body vibrates in a primary mode of a flexural vibration in a Y-axis direction.
Figure 4B:
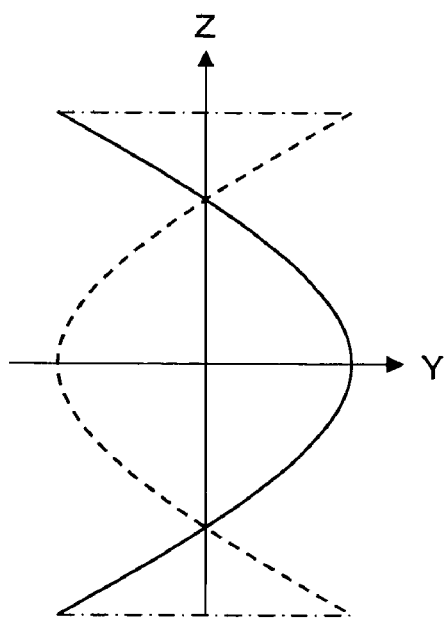

Next, an operation of the vibration actuator according to the first embodiment of the present invention will be described. When an alternating current voltage is applied to the electrode plate 31c of the first piezoelectric element portion 31 by the driving circuit 36 to generate in the first piezoelectric element portion 31 the flexural vibration of the primary mode in the Y-axis direction, the two portions mutually divided of each piezoelectric element plate 31b and 31d of the first piezoelectric element portion 31 alternately repeat expansion and contraction in the Z-axis direction, therefore the actuator main body 1 vibrates as shown in FIG. 4a. Here, displacement in the Y-axis direction of each portion of the actuator main body 1 of FIG. 4a is shown in FIG. 4b. With reference to FIG. 4b, it is understood that both end portions of the actuator main body 1, that is, the corner portion 8 of the first stator 3 and the corner portion 9 of the second stator 4 vibrate in the same phase.

Figure 5A:
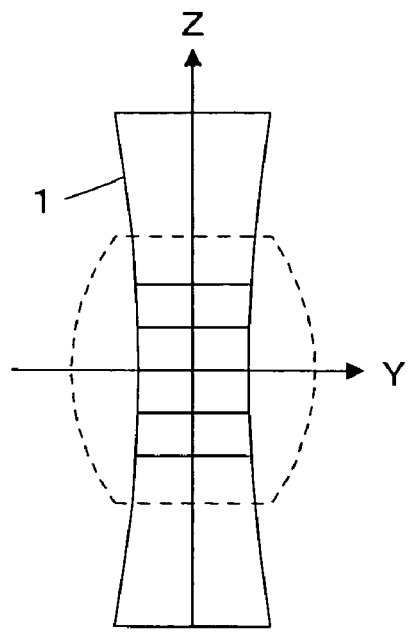
FIG. 5a is a view showing a state where the actuator main body vibrates in a primary mode of a longitudinal vibration in a Z-axis direction.
Figure 5B:
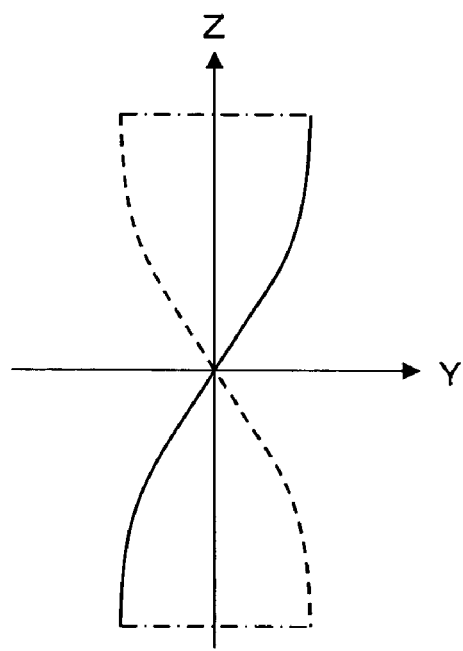
FIG. 5b is a view showing displacement in the Z-axis direction of each portion of the actuator main body shown in FIG. 5a with the displacement in the Z-axis direction converted into that in the Y-axis direction.

Further, when an alternating current voltage is applied to the electrode plate 32c of the second piezoelectric element portion 32 by the driving circuit 36 to generate in the second piezoelectric element portion 32 the longitudinal vibration of the primary mode in the Z-axis direction, both of piezoelectric element plates 32b and 32d of the second piezoelectric element portion 32 alternately repeat expansion and contraction in the Z-axis direction, therefore the actuator main body 1 vibrates as shown in FIG. 5a. Here, displacement in the Z-axis direction of each portion of the actuator main body 1 of FIG. 5a is shown in FIG. 5b with the displacement in the Z-axis direction converted into that in the Y-axis direction. With reference to FIG. 5b, it is understood that both end portions of the actuator main body 1, that is, the corner portion 8 of the first stator 3 and the corner portion 9 of the second stator 4 vibrate in the opposite phases with respect to each other.

Figure 6:
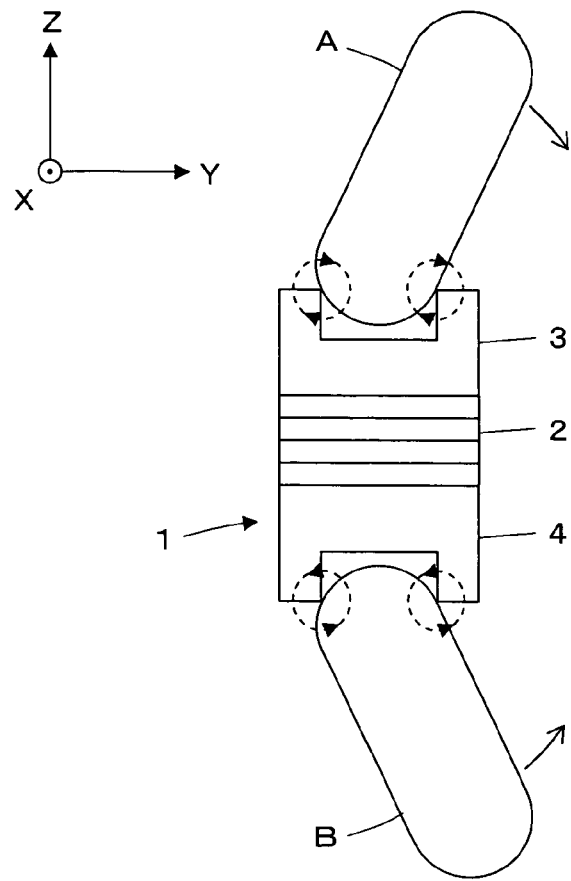
FIG. 6 is a view showing a state where two rotors in the first embodiment are rotated in directions opposite to each other.

Now, by applying the alternating current voltages having phases shifted by 90 degrees with respect to each other to the electrode plate 31c of the first piezoelectric element portion 31 and the electrode plate 32c of the second piezoelectric element portion 32, a composite vibration combining the flexural vibration of the primary mode in the Y-axis direction and the longitudinal vibration of the primary mode in the Z-axis direction is generated by the composite vibrator 2. In this case, the corner portion 8 of the first stator 3 and the corner portion 9 of the second stator 4 are displaced in the same phase in the Y-axis direction due to the flexural vibration of the primary mode in the Y-axis direction, and are displaced in opposite phases with respect to each other in the Z-axis direction due to the longitudinal vibration of the primary mode in the Z-axis direction. Thus, as shown in FIG. 6, in the corner portion 8 of the first stator 3 and the corner portion 9 of the second stator 4, elliptical movements in opposite directions with respect to each other are caused in a YZ plane. Accordingly, the first rotor A abutting onto and pressurized against the corner portion 8 of the first stator 3 and the second rotor B abutting onto and pressurized against the corner portion 9 of the second stator 4 are rotated in the opposite directions with respect to each other at the same time about the X axis.

Figure 7:
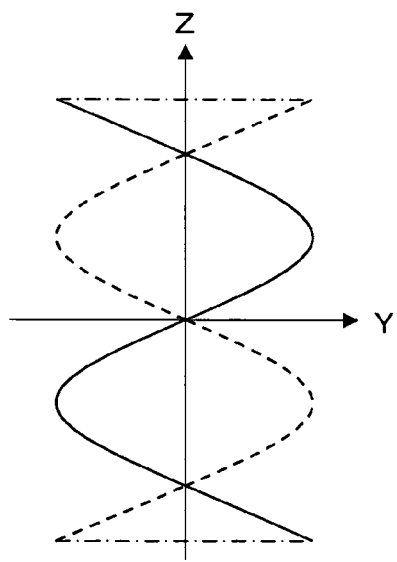
FIG. 7 is a view showing displacement in the Y-axis direction of each portion of the actuator main body vibrating in a secondary mode of a flexural vibration in the Y-axis direction.

Further, FIG. 7 shows the displacement in the Y-axis direction of each portion of the actuator main body 1 in a case where the flexural vibration of the secondary mode in the Y-axis direction is caused in the first piezoelectric element portion 31. With reference to FIG. 7, it is understood that the both end portions of the actuator main body 1, that is, the corner portion 8 of the first stator 3 and the corner portion 9 of the second stator 4 vibrate in the opposite phases with respect to each other.

Figure 8:
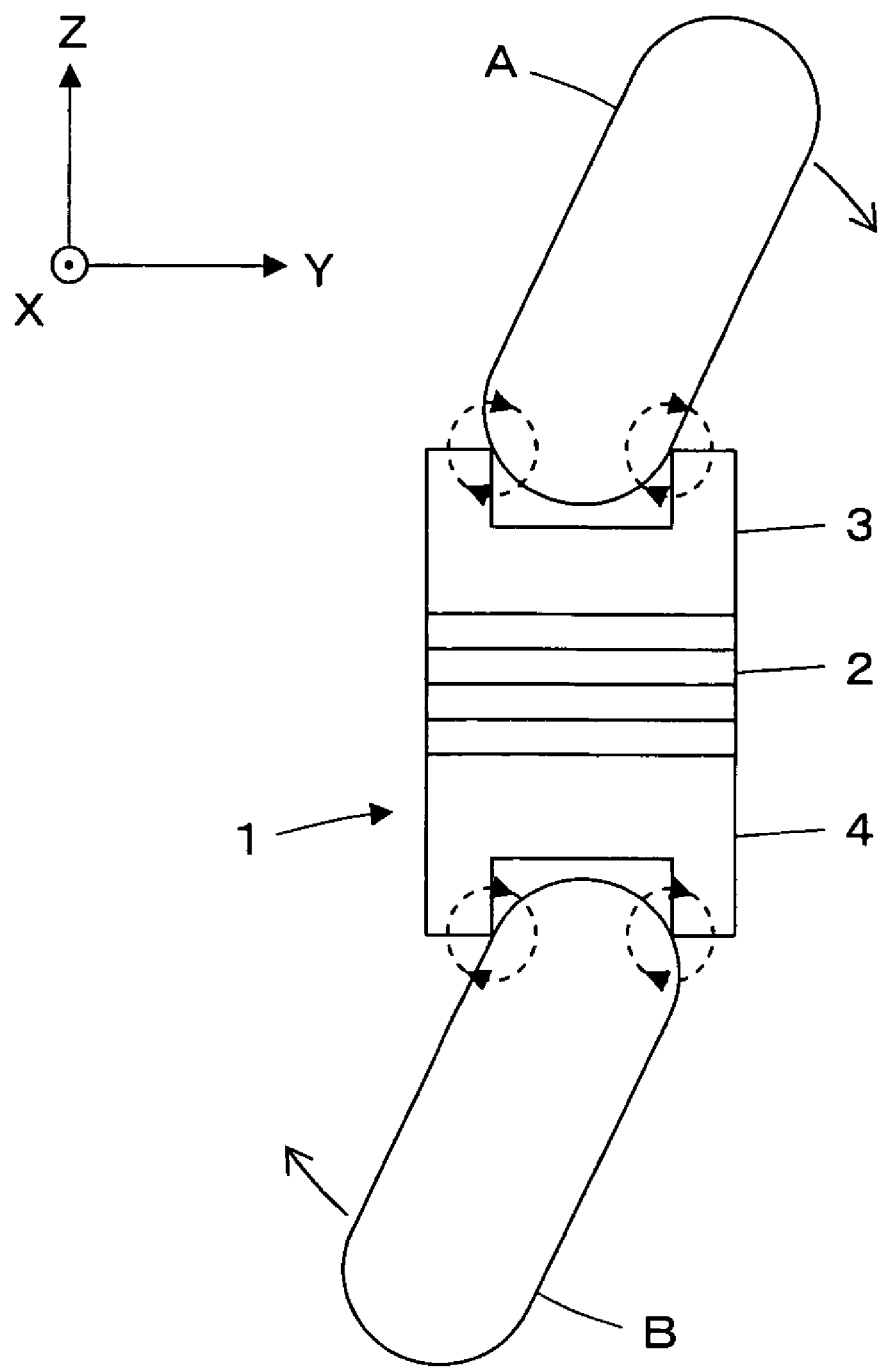
FIG. 8 is a view showing a state where the two rotors in the first embodiment are rotated in the same direction.

Now, by applying the alternating current voltages having phases shifted by 90 degrees with respect to each other to the electrode plate 31c of the first piezoelectric element portion 31 and the electrode plate 32c of the second piezoelectric element portion 32, a composite vibration combining the flexural vibration of the secondary mode in the Y-axis direction and the longitudinal vibration of the primary mode in the Z-axis direction is generated by the composite vibrator 2. In this case, the corner portion 8 of the first stator 3 and the corner portion 9 of the second stator 4 are displaced in the opposite phases with respect to each other in the Y-axis direction due to the flexural vibration of the secondary mode in the Y-axis direction, and are displaced in opposite phases with respect to each other in the Z-axis direction due to the longitudinal vibration of the primary mode in the Z-axis direction. Thus, as shown in FIG. 8, in the corner portion 8 of the first stator 3 and the corner portion 9 of the second stator 4, elliptical movements in the same direction are caused in the YZ plane. Accordingly, the first rotor A abutting onto and pressurized against the corner portion 8 of the first stator 3 and the second rotor B abutting onto and pressurized against the corner portion 9 of the second stator 4 are rotated in the same direction at the same time about the X axis.

As described above, by generating the composite vibration with the single composite vibrator 2 to thereby cause the elliptical movements in contact portions of the stators 3 and 4 abutting to the corresponding rotors A and B, respectively, the two rotors A and B can be rotated at the same time. Accordingly, by employing the vibration actuator of the present invention, a joint mechanism or the like having a plurality of joint portions to be rotated can be realized with a simple structure, thereby making it possible to achieve reduction in size and weight.

Further, by selecting a combination of a vibration mode of the longitudinal vibration in the Z-axis direction and a vibration mode of the flexural vibration in the Y-axis direction, the first rotor A and the second rotor B can be rotated in the same direction or in the opposite directions with respect to each other.

Since the vibration actuator is an ultrasonic actuator employing ultrasonic vibration, the vibration actuator has high torque performance and can be driven without using a gear.

Further, when the springs 12 and 13, wirings for connecting the piezoelectric element portions 31 and 32 to the driving circuit 36, and the like are accommodated in the inside of the actuator main body 1 and rotors A and B, the vibration actuator as a whole can be downsized.

Figure 9:
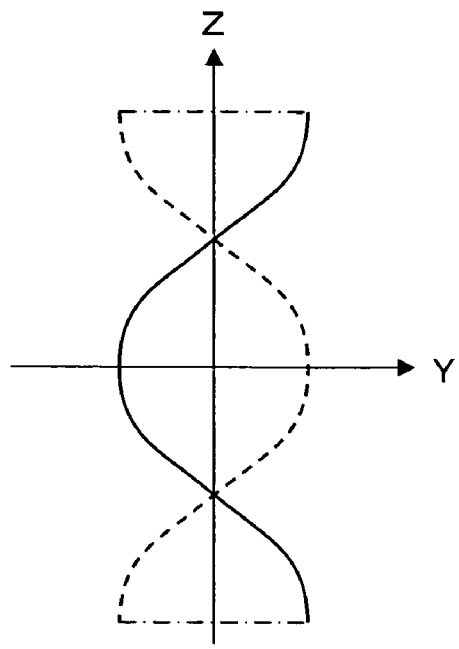
FIG. 9 is a view showing displacement in the Z-axis direction of each portion of the actuator main body vibrating in a secondary mode of a longitudinal vibration in the Z-axis direction with the displacement in the Z-axis direction converted into that in the Y-axis direction.

Note that, FIG. 9 shows the displacement in the Z-axis direction of each portion of the actuator main body 1 in a case where the longitudinal vibration of the secondary mode in the Z-axis direction is caused in the second piezoelectric element portion 32 with the displacement in the Z-axis direction converted into that in the Y-axis direction. With reference to FIG. 9, it is understood that the both end portions of the actuator main body 1, that is, the corner portion 8 of the first stator 3 and the corner portion 9 of the second stator 4 vibrate in the same phase.

Accordingly, when the composite vibration combining the flexural vibration of the primary mode in the Y-axis direction and the longitudinal vibration of the secondary mode in the Z-axis direction is generated, similarly to the case where the composite vibration combining the flexural vibration of the secondary mode in the Y-axis direction and the longitudinal vibration of the primary mode in the Z-axis direction is generated, the two rotors A and B can be rotated in the same direction about the X axis.

Further, the vibration actuator can be used with the actuator main body 1 being fixed to a stationary object or with one of the first rotor A and the second rotor B being fixed to the stationary object.

Figure 10:
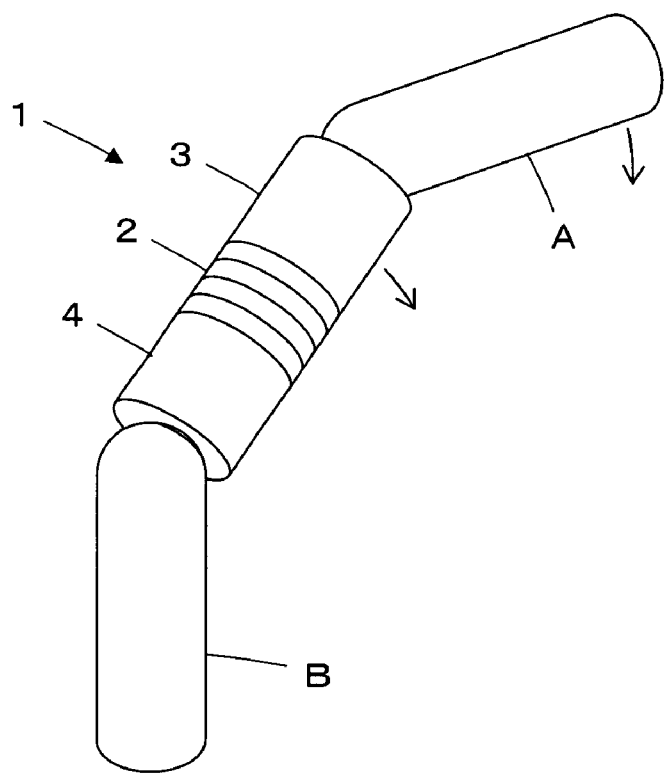
FIG. 10 is a view showing a state where the actuator main body and one rotor rotate in the same direction while the other rotor is fixed to a stationary object.

For example, in a case where the second rotor B is fixed to the stationary object, when the composite vibration combining the longitudinal vibration of the primary mode in the Z-axis direction and the flexural vibration of the primary mode in the Y-axis direction is generated by the composite vibrator 2, as shown in FIG. 10, the actuator main body 1 relatively rotates with respect to the second rotor B, and the first rotor A rotates with respect to the actuator main body 1 in the same direction as the rotation direction of the actuator main body 1.

Figure 11:
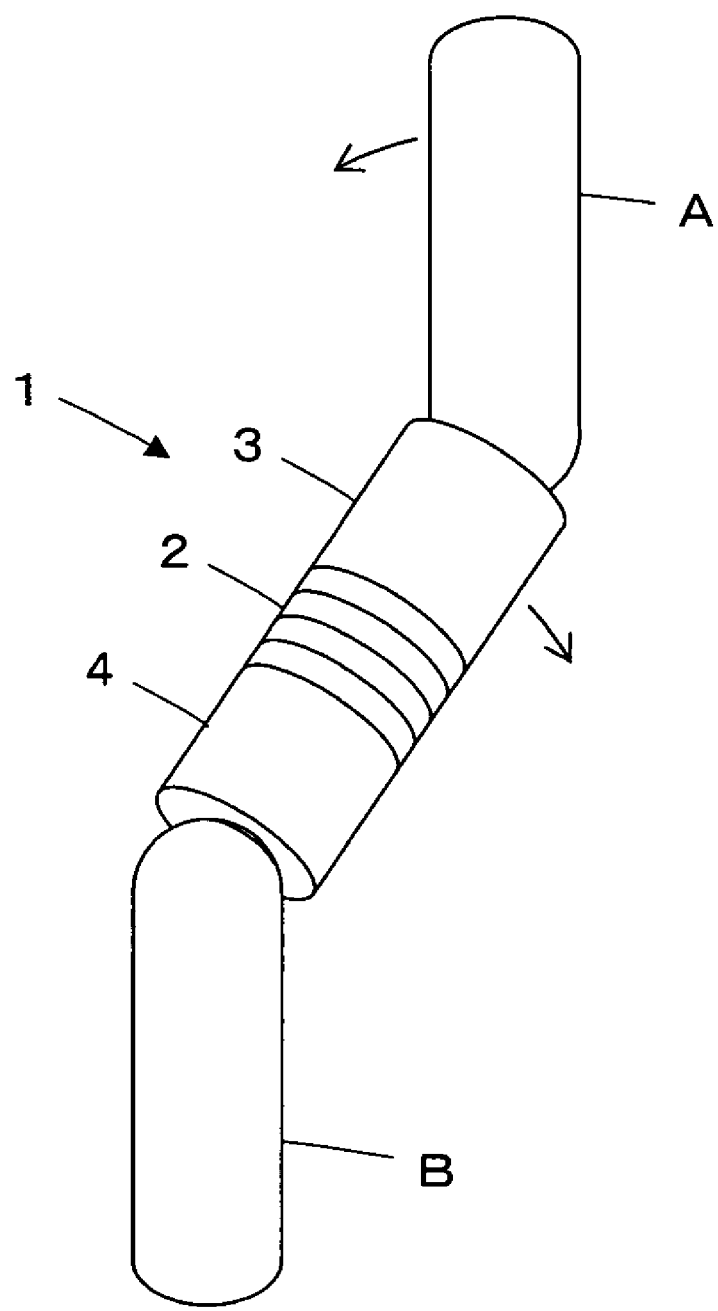
FIG. 11 is a view showing a state where the actuator main body and one rotor rotate in the opposite directions with respect to each other while the other rotor is fixed to a stationary object.

Further, when, for example, the composite vibration combining the longitudinal vibration of the primary mode in the Z-axis direction and the flexural vibration of the secondary mode in the Y-axis direction is generated by the composite vibrator 2, as shown in FIG. 11, the actuator main body 1 relatively rotates with respect to the second rotor B, and the first rotor A rotates with respect to the actuator main body 1 in a direction opposite to the rotation direction of the actuator main body 1.

Note that, instead of the first piezoelectric element portion 31 generating the flexural vibration in the Y-axis direction or of the second piezoelectric element portion 32 generating the longitudinal vibration in the Z-axis direction, a piezoelectric element portion generating a flexural vibration in the X-axis direction may be used. That is, by generating a composite vibration combining the flexural vibration in the X-axis direction and the longitudinal vibration in the Z-axis direction, or by generating a composite vibration combining the flexural vibration in the X-axis direction and the flexural vibration in the Y-axis direction, it is possible to rotate the two rotors A and B at the same time about the Y axis or the Z axis. Further, in both cases, by selecting a combination of the vibration modes of the two vibrations constituting the composite vibration, the two rotors A and B can be rotated in the same direction or in the opposite directions with respect to each other.

Second Embodiment

Figure 12:
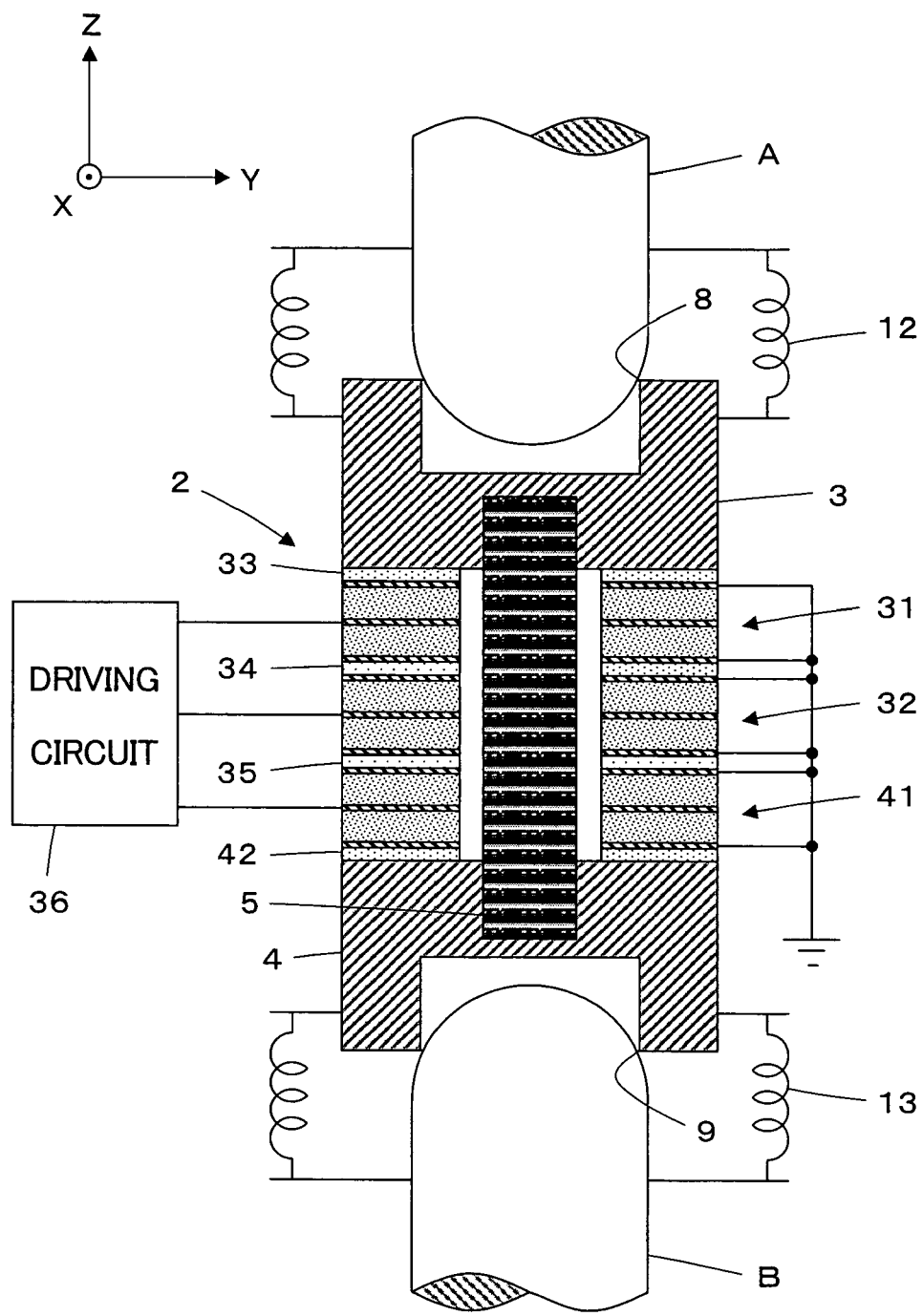
FIG. 12 is a sectional view showing a vibration actuator according to a second embodiment of the present invention.
Figure 13:
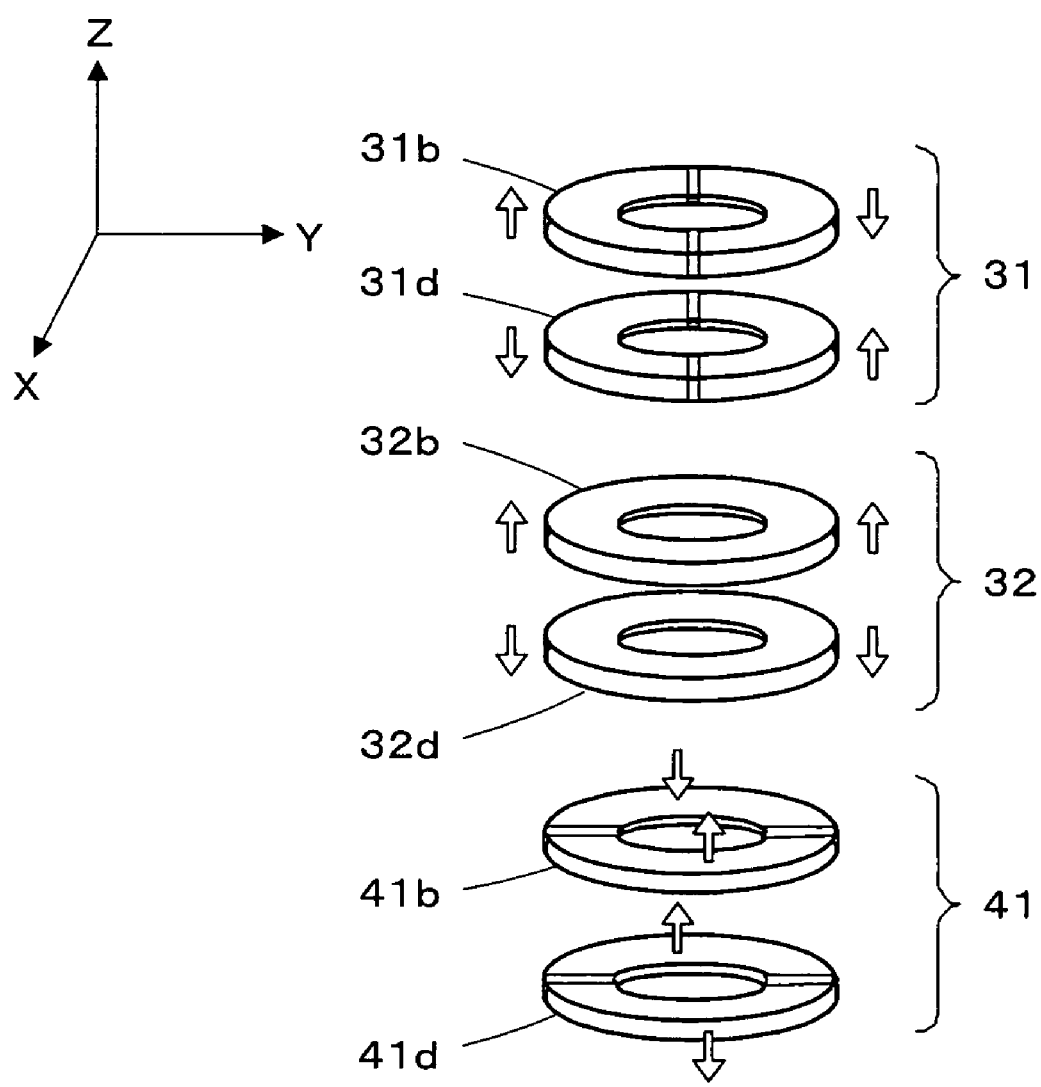
FIG. 13 is a perspective view showing a polarization direction of three pairs of piezoelectric element plates of the composite vibrator used in the second embodiment.

Next, with reference to FIG. 12, a description will be made of a vibration actuator according to a second embodiment of the present invention. Compared to the first embodiment, in the second embodiment, the composite vibrator 2 has a third piezoelectric element portion 41 generating the flexural vibration in the X-axis direction in addition to the first piezoelectric element portion 31 generating the flexural vibration in the Y-axis direction and the second piezoelectric element portion 32 generating the longitudinal vibration in the Z-axis direction. The third piezoelectric element portion 41 has a pair of piezoelectric element plates 41b and 41d as shown in FIG. 13. Each of piezoelectric element plates 41b and 41d is divided into two portions in the X-axis direction and is polarized so that the two portions thereof have opposite polarities to exhibit opposite deformation behaviors to each other, that is, expansion and contraction in the Z-axis direction (thickness direction). The piezoelectric element plate 41b and the piezoelectric element plate 41d are arranged in reverse orientations to each other.

Note that, the third piezoelectric element portion 41 has the same structure as that of the first piezoelectric element portion 31 or the second piezoelectric element portion 32 except for the pair of piezoelectric element plates 41b and 41d. The third piezoelectric element portion 41 is stacked together with the first piezoelectric element portion 31 and the second piezoelectric element portion 32. A pair of electrode plates arranged on both surface sides of the third piezoelectric element portion 41 are electrically grounded, respectively, and an electrode plate arranged between the pair of piezoelectric element plates 41b and 41d is connected to the driving circuit 36. Further, the three piezoelectric element portions 31, 32, and 41 are arranged so as to be electrically insulated from the two stators 3 and 4 and from each other through the intermediation of the insulating sheets 33 to 35 and an insulating sheet 42.

When an alternating current voltage is applied to the electrode plate of the third piezoelectric element portion 41 by the driving circuit 36 to drive the third piezoelectric element portion 41, the two portions mutually divided of each piezoelectric element plate 41b and 41d of the third piezoelectric element portion 41 alternately repeat expansion and contraction in the Z-axis direction. Therefore, the flexural vibration in the X-axis direction is generated in the first stator 3 and the second stator 4.

By driving the composite vibrator 2 to generate a composite vibration combining at least two or all three vibrations of the flexural vibration in the Y-axis direction by the first piezoelectric element portion 31, the longitudinal vibration in the Z-axis direction by the second piezoelectric element portion 32, and the flexural vibration in the X-axis direction by the third piezoelectric element portion 41, the elliptical movements are caused in the corner portion 8 of the first stator 3 and the corner portion 9 of the second stator 4, respectively. Thus, the first rotor A and the second rotor B can be freely rotated on three-dimensions at the same time. Further, also in this case, the two rotors A and B can be rotated in the same direction or the opposite directions with respect to each other, by selecting the combination of the vibration mode.

Third Embodiment

Figure 14:
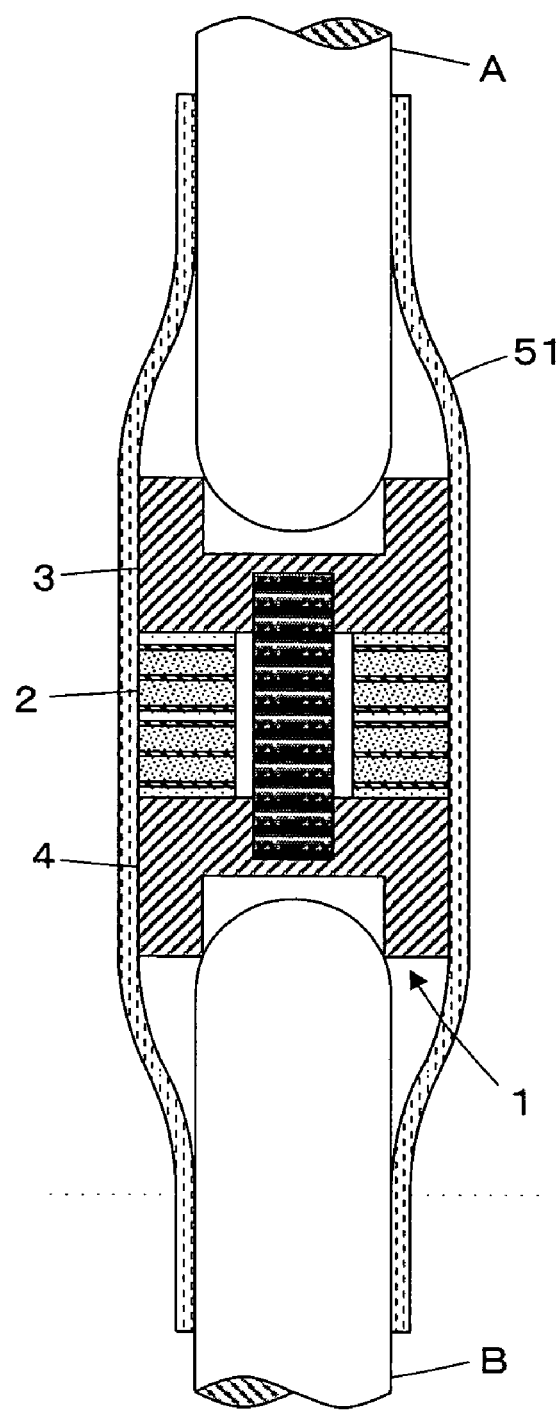
FIG. 14 is a sectional view showing a vibration actuator according to a third embodiment of the present invention.

Next, with reference to FIG. 14, a description will be made of a vibration actuator according to a third embodiment of the present invention. Compared to the first embodiment, in the third embodiment, the two rotors A and B are caused to contact with and pressurized against the corresponding stators 3 and 4, respectively, by using an elastic rubber cover 51, instead of using the springs 12 and 13. The rubber cover 51 has a cylindrical shape and covers an entire outer peripheral portion of the actuator main body 1. Both end portions of the rubber cover 51 are fixed to outer peripheral portions of the first rotor A and the second rotor B, respectively, in a state where the rubber cover 51 is stretched in a central-axial direction. Due to a biasing force of the rubber cover 51, the two rotors A and B are caused to contact with and pressurized against the corner portions 8 and 9 of the corresponding stators 3 and 4, respectively. Accordingly, similarly to the first embodiment of the present invention, the two rotors A and B can be rotated by use of the single composite vibrator 2.

Note that, also in the vibration actuator according to the second embodiment of the present invention, the rotors A and B can be caused to contact with and pressurized against the corresponding stators 3 and 4, respectively, by using the rubber cover 51 instead of the springs 12 and 13.

Fourth Embodiment

Figure 15:
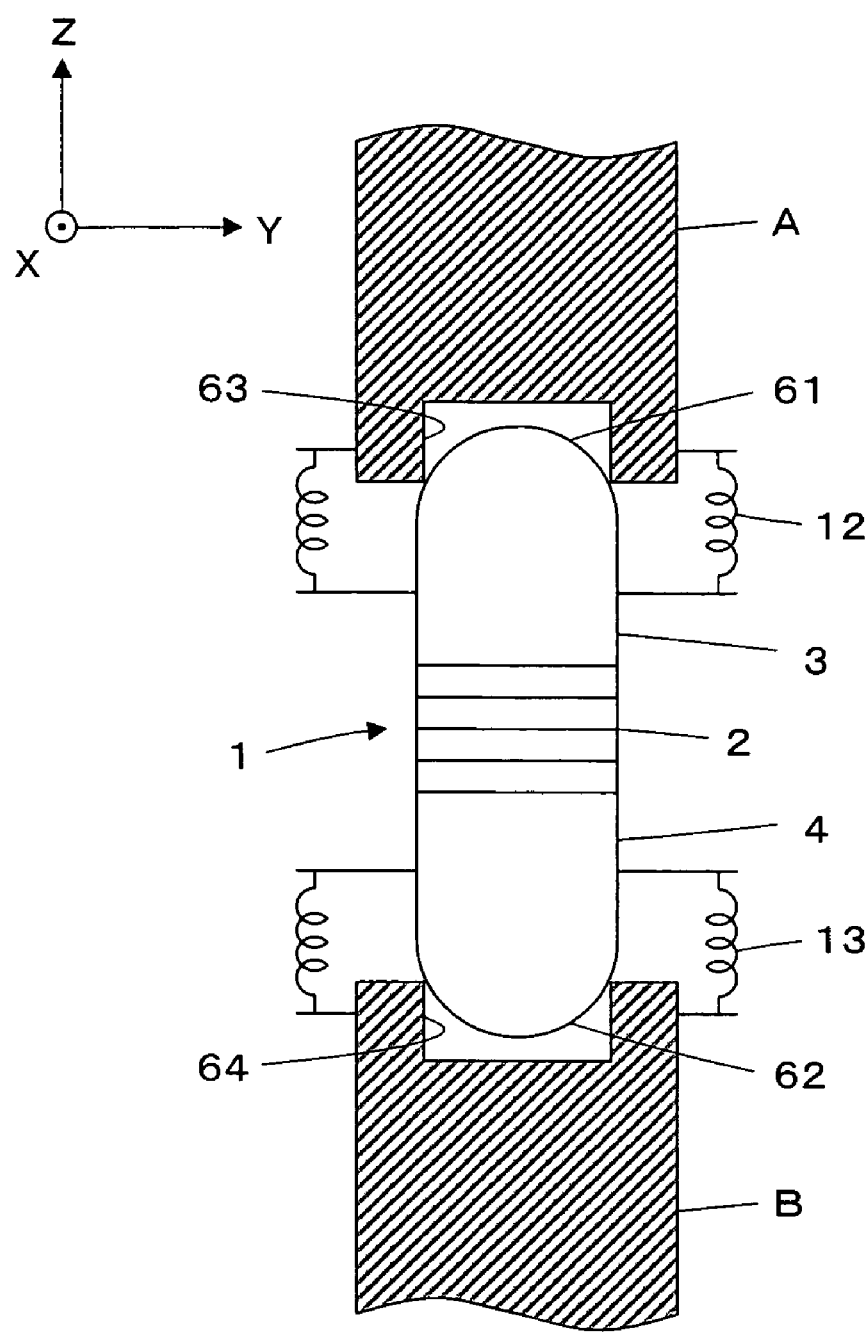
FIG. 15 is a sectional view showing a vibration actuator according to a fourth embodiment of the present invention.

Next, with reference to FIG. 15, a description will be made of a vibration actuator according to the fourth embodiment of the present invention. Compared to the first embodiment, in the fourth embodiment, relationships between the recesses of the stators 3 and 4 and the convex portions of the rotors A and B are reversed to each other. That is, the stators 3 and 4 have semispherical convex portions 61 and 62, respectively, on the opposite sides to surfaces thereof in contact with the composite vibrator 2. The rotors A and B are provided with recesses 63 and 64 formed in surfaces thereof opposed to the corresponding stators 3 and 4, respectively. Opening end peripheral portions of the recesses 63 and 64 of the rotors A and B are provided with annular corner portions, respectively. The corner portions of the rotors A and B abut onto the convex portions 61 and 62 of the corresponding stators 3 and 4, respectively, to be rotatably supported.

Note that, similarly to the first embodiment of the present invention, the rotors A and B are caused to contact with and pressurized against the corresponding stators 3 and 4 by the springs 12 and 13, respectively.

Even with this structure, by generating a composite vibration with the composite vibrator 2 to thereby cause elliptical movements in contact portions of the stators 3 and 4 abutting to the corresponding rotors A and B, respectively, the two rotors A and B can be rotated. Further, by selecting a combination of vibration modes of two vibrations constituting the composite vibration, the two rotors A and B can be rotated in the same direction or in the opposite directions with respect to each other. As a result, the same effect as that of the first embodiment of the present invention can be obtained.

Note that, also in the vibration actuator according to the second and third embodiments of the present invention, the stators 3 and 4 may be provided with the convex portions and the rotors A and B may be provided with the recesses.

Fifth Embodiment

Figure 16:
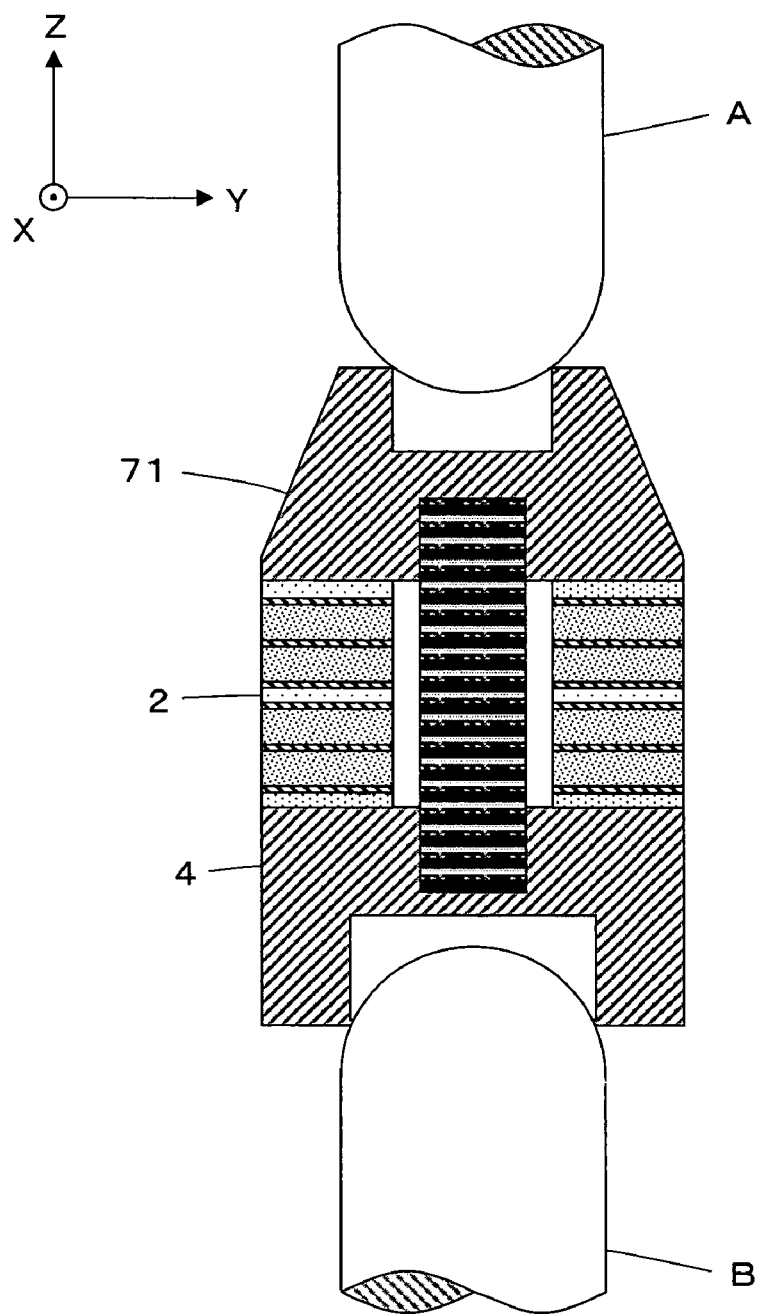
FIG. 16 is a sectional view showing a vibration actuator according to a fifth embodiment of the present invention.

Next, with reference to FIG. 16, a description will be made of a vibration actuator according to a fifth embodiment of the present invention. Compared to the first embodiment, in the fifth embodiment, a stator 71 formed so as to be gradually reduced in diameter toward a contact portion abutting to the rotor A is used as the first stator while the second stator 4 is used as it is. Therefore, at a time of driving of the composite vibrator 2, the elliptical movement caused in the contact portion of the first stator 71 abutting to the rotor A has an amplitude larger than that of the elliptical movement caused in the contact portion of the second stator 4 abutting to the rotor B. Thus, a torque generated in the first rotor A becomes larger than a torque generated in the second rotor B. As described above, by forming the contact portions of the first stator 71 and the second stator 4 abutting to the corresponding rotors A and B, respectively, into different shapes with respect to each other, torques of different magnitudes can be generated in the two rotors A and B.

Note that, also in the second and third embodiments of the present invention, by forming the contact portions of the two stators abutting to the corresponding rotors A and B, into different shapes with respect to each other, the torques of different magnitudes can be generated in the two rotors A and B, respectively.

Figure 17:
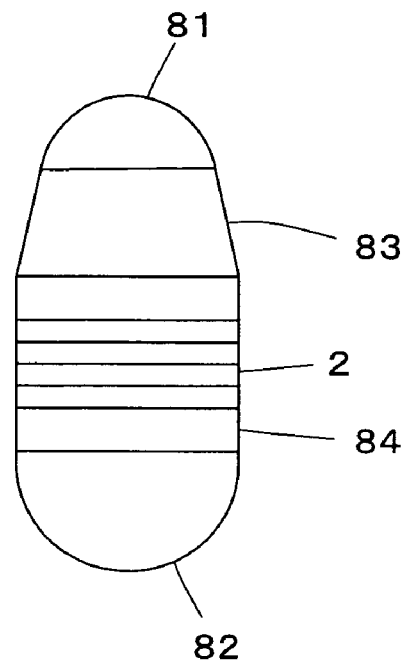
FIG. 17 is a side view showing an actuator main body in a modified example of the fifth embodiment of the present invention.
Figure 18:
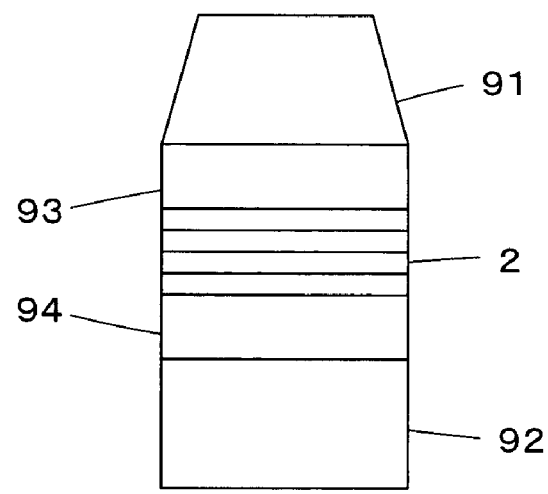
FIG. 18 is a side view showing an actuator main body in another modified example of the fifth embodiment of the present invention.

Further, in the fourth embodiment of the present invention, there may be used, for example, a pair of stators 83 and 84 having semispherical convex portions 81 and 82 which differ in radius from each other as shown in FIG. 17, or a pair of stators 93 and 94 having a truncated cone-shaped convex portion 91 gradually reduced in diameter toward a tip thereof and a column-shaped convex portion 92, respectively, as shown in FIG. 18. In both cases, torques of different magnitudes can be generated in the two rotors A and B, respectively.

Note that, instead of stators, the contact portions of the two rotors abutting to the corresponding stators may be formed into different shapes or different sizes with respect to each other.

Further, in the above embodiments, the flexural vibration in the X-axis direction, the flexural vibration in the Y-axis direction, and the longitudinal vibration in the Z-axis direction are generated by different piezoelectric element portions, and the composite vibration is generated by combining the vibrations. However, one piezoelectric element portion may be divided into a plurality of portions, each of which is polarized, to separately control voltages applied to electrodes corresponding to the polarized portions. That is, the voltages in which alternating current voltages different from each other in phases and amplitudes or the like are mutually combined may be applied to the electrodes to generate a composite vibration by a single piezoelectric element portion.

Further, in the above embodiments, the elliptical movement is caused in the contact portion between the stator and the rotor. However, a circular movement may be caused in the contact portions by controlling amplitudes in respective axial directions thereof.

The invention claimed is:

1. A vibration actuator, comprising:
    two stators;
    two rotors arranged so as to be in contact with the two stators, respectively;
    a single vibration means arranged between the two stators for generating a composite vibration combining a plurality of vibrations in different directions to vibrate the two stators, thereby rotating the two rotors at the same time;
    wherein contact portions of the two stators abutting to the corresponding rotors are formed in sizes different from each other.

2. A vibration actuator according to claim 1, further comprising a driving circuit for driving the vibration means,
    the driving circuit selecting a combination of vibration modes of the plurality of vibrations constituting the composite vibration generated by the vibration means to thereby rotate the two rotors in the same direction with each other.

3. A vibration actuator according to claim 1, further comprising a driving circuit for driving the vibration means,
    the driving circuit selecting a combination of vibration modes of the plurality of vibrations constituting the composite vibration generated by the vibration means to thereby rotate the two rotors in opposite directions with respect to each other.

4. A vibration actuator according to claim 1, wherein the vibration means comprises a composite vibrator including a plurality of piezoelectric element plates stacked on each other,
    the two stators being arranged on both end portions in a stacking direction of the piezoelectric element plates, respectively.

5. A vibration actuator according to claim 4, wherein the plurality of piezoelectric element plates correspond to the plurality of vibrations in different directions.

6. A vibration actuator according to claim 1, wherein contact portions of the two stators abutting to the corresponding rotors are formed into shapes different from each other.

7. A vibration actuator according to claim 1, wherein the contact portions of the two stators abutting to the corresponding rotors are formed to have spherical surfaces with radii different from each other.

8. A vibration actuator according to claim 1, wherein the contact portions of the two stators abutting to the corresponding rotors are formed to have circumferential surfaces with radii different from each other.

9. A vibration actuator according to claim 1, wherein the vibration means generates the composite vibration to cause elliptical movements in contact portions of the stators abutting to the corresponding rotors so that the two rotors are rotated at the same time.

10. A vibration actuator according to claim 1, wherein the vibration means generates the composite vibration to cause circular movements in contact portions of the stators abutting to the corresponding rotors so that the two rotors are rotated at the same time.

* * * * *